(12) United States Patent
Harada

(10) Patent No.: US 8,030,672 B2
(45) Date of Patent: Oct. 4, 2011

(54) SEMICONDUCTOR LIGHT EMITTING DEVICE INCLUDING A PLURALITY OF SEMICONDUCTOR LIGHT EMITTING ELEMENTS AND A WAVELENGTH CONVERSION LAYER HAVING DIFFERENT THICKNESS PORTIONS

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 303 days.

(21) Appl. No.: 12/394,976

(22) Filed: Feb. 27, 2009

(65) Prior Publication Data

US 2009/0212305 A1    Aug. 27, 2009

(30) Foreign Application Priority Data

Feb. 27, 2008  (JP) ................................ 2008-045776

(51) Int. Cl.
| | |
|---|---|
| H01L 29/18 | (2006.01) |
| H01L 33/00 | (2006.01) |
| H01L 27/15 | (2006.01) |
| H01L 29/26 | (2006.01) |
| H01L 31/12 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ....... 257/88; 257/13; 257/79; 257/E31.001; 257/E33.001

(58) Field of Classification Search .............. 257/13, 257/79, 88, E31.001, E33.001
See application file for complete search history.

(56) References Cited

U.S. PATENT DOCUMENTS

| | | | | |
|---|---|---|---|---|
| 6,309,486 | B1 * | 10/2001 | Kawaguchi et al. | 156/67 |
| 6,611,000 | B2 * | 8/2003 | Tamura et al. | 257/80 |
| 7,284,871 | B2 * | 10/2007 | Oon et al. | 362/17 |
| 7,888,858 | B2 * | 2/2011 | Cok et al. | 313/503 |
| 2005/0233485 | A1 * | 10/2005 | Shishov et al. | 438/25 |
| 2006/0284195 | A1 * | 12/2006 | Nagai | 257/98 |
| 2007/0054149 | A1 * | 3/2007 | Cheng et al. | 428/690 |
| 2007/0096131 | A1 * | 5/2007 | Chandra | 257/99 |
| 2007/0223081 | A1 * | 9/2007 | Yoshino et al. | 359/326 |
| 2007/0284563 | A1 * | 12/2007 | Lee et al. | 257/13 |
| 2008/0024402 | A1 * | 1/2008 | Nishikawa et al. | 345/82 |
| 2009/0008655 | A1 * | 1/2009 | Peeters et al. | 257/89 |
| 2009/0102352 | A1 * | 4/2009 | Cok et al. | 313/498 |
| 2009/0194774 | A1 * | 8/2009 | Huang et al. | 257/88 |
| 2010/0102340 | A1 * | 4/2010 | Ooya et al. | 257/98 |
| 2010/0308361 | A1 * | 12/2010 | Beeson et al. | 257/98 |
| 2011/0001422 | A1 * | 1/2011 | Aanegola et al. | 313/501 |

FOREIGN PATENT DOCUMENTS

JP     2007059260     3/2007

* cited by examiner

*Primary Examiner* — Ida M Soward
(74) *Attorney, Agent, or Firm* — Kenealy Vaidya LLP

(57) ABSTRACT

A semiconductor light emitting device can vary color temperatures of its emission light and have a simple and small configuration. The semiconductor light emitting device can include a substrate, electrode wiring formed on the substrate, a plurality of semiconductor light emitting elements mounted on the electrode wiring, and a wavelength conversion layer surrounding the semiconductor light emitting elements. The semiconductor light emitting elements constitute a first semiconductor light emitting element group and a second semiconductor light emitting element group. The wavelength conversion layer has a thinner portion corresponding to the first group and a thicker portion corresponding to the second group and can be differentiated by a step provided on the substrate.

19 Claims, 7 Drawing Sheets

SEMICONDUCTOR LIGHT EMITTING DEVICE INCLUDING A PLURALITY OF SEMICONDUCTOR LIGHT EMITTING ELEMENTS AND A WAVELENGTH CONVERSION LAYER HAVING DIFFERENT THICKNESS PORTIONS

This application claims the priority benefit under 35 U.S.C. §119 of Japanese Patent Application No. 2008-045776 filed on Feb. 27, 2008, which is hereby incorporated in its entirety by reference.

BACKGROUND

1. Technical Field

The presently disclosed subject matter relates to a semiconductor light emitting device, and in particular, to a semiconductor light emitting device having a plurality of semiconductor light emitting elements and a wavelength conversion layer including a wavelength conversion material, such as a phosphor.

2. Description of the Related Art

Recent semiconductor light emitting elements that include light emitting diodes have been improving in terms of high power and high brightness characteristics. In connection with this improvement, such semiconductor light emitting elements have recently been applied to new fields of illumination devices, including general lighting, street lighting, headlamps, and the like. In recent years, illumination devices have included a plurality of types of semiconductor light emitting elements that each have different emission wavelengths such that driving conditions can be adjusted for, and respective semiconductor light emitting elements can be controlled in order to vary the color temperature as a whole.

As an example of the structure of such an illumination device that is capable of varying color temperature, an illumination device is proposed in Japanese Patent Application Laid-Open No. 2007-059260. In this publication, the illumination device includes a daylight semiconductor light emitting element, an incandescent color semiconductor light emitting element, and a green color semiconductor light emitting element. The illumination device can emit light with color temperatures ranging from daylight color to incandescent lamp color (on the blackbody radiation trajectory) with the help of the green color semiconductor light emitting element. In another configuration, an incandescent color semiconductor light emitting element and a blue semiconductor light emitting element are used in combination to emit light with color temperatures ranging from daylight color to incandescent lamp color and can be linearly changed.

SUMMARY

The illumination device disclosed in Japanese Patent Application Laid-Open No. 2007-059260, however, requires a complex driving device in order to separately drive the plurality of semiconductor light emitting elements to emit different emission wavelengths. In addition to this, the color of light emitted from the respective semiconductor light emitting elements must be uniformly mixed. To do so, these semiconductor light emitting elements should be integrated in a high density fashion. Even with the integration of the semiconductor light emitting elements in a high density format, the miniaturization of the illumination device has a certain limit. In order to achieve a uniformity of the color by color mixing, other optical components including a reflector, a light diffusion plate, a lens, and the like may be required. Thus, the size and cost of the illumination device may increase.

The illumination device disclosed in Japanese Patent Application Laid-Open No. 2007-059260 is of a system utilizing a unicolor auxiliary light source in combination. In this system, all of the semiconductor light emitting elements cannot be always driven with a maximum rated current. Furthermore, the system requires a unicolor auxiliary light source in combination. This configuration can increase its cost and need a complex control circuit. Furthermore, the auxiliary light source cannot emit white light by itself.

The presently disclosed subject matter was devised in view of these and other characteristics, features, and problems and in association with the conventional art. According to an aspect of the presently disclosed subject matter, a semiconductor light emitting device can vary color temperatures of its emission light with a simple and small configuration.

According to another aspect of the presently disclosed subject matter, a semiconductor light emitting device can consistently drive its semiconductor light emitting elements with its maximum rated current, and accordingly, can emit light with a high intensity and in a highly efficient manner while the color temperature of the emission light can be varied in an appropriate manner.

The semiconductor light emitting device made in accordance with the principles of the presently disclosed subject matter can include a substrate having electrode wiring, a plurality of semiconductor light emitting elements mounted on the electrode wiring of the substrate, the semiconductor light emitting elements being grouped into at least two groups, and a wavelength conversion layer configured to wavelength-convert at least part of the light emitted from the plurality of semiconductor light emitting elements, the wavelength conversion layer having different thickness portions corresponding to the respective two or more groups of the semiconductor light emitting elements and being formed in an integrated body.

According to another aspect of the disclosed subject matter, a semiconductor light emitting device can be configured to accurately produce emission light with different color temperatures by varying the thickness of the wavelength conversion layer that is integrally formed on the grouped semiconductor light emitting elements. The grouped semiconductor light emitting elements can be separately driven to emit illumination light with different color temperatures and can be adjustable with high accuracy.

In addition, there can be provided a highly reliable semiconductor light emitting device that does not experience problems due to color shift from the original color at the device's lighting-up time that can result from different temperature dependencies of respective semiconductor light emitting elements.

The semiconductor light emitting device made in accordance with the principles of the presently disclosed subject matter can have the same type of semiconductor light emitting elements. In some conventional devices, there are problems associated with the difference in electric properties and/or optical characteristics of individual semiconductor light emitting elements, in which the characteristics can be changed from the original characteristics at the elements' lighting-up time. According to an aspect of the disclosed subject matter, a semiconductor light emitting device made in accordance with principles of the presently disclosed subject matter can remove these problems and provide high reliability.

The plurality of semiconductor light emitting elements employed in a semiconductor light emitting device made in accordance with principles of the presently disclosed subject matter can have the same composition.

When each of the semiconductor light emitting elements have the same composition in order to emit light with the same wavelength, the light emitted from the device as a whole can be varied by adjusting only the wavelength conversion layer in terms of thickness at corresponding areas to easily provide required color temperatures within a desired color temperature range.

In another semiconductor light emitting device made in accordance with the principles of the presently disclosed subject matter, mounting portions of the substrate for mounting the semiconductor light emitting elements thereon can be varied in thickness. This configuration can provide the different thicknesses of the wavelength conversion layer above the semiconductor light emitting elements.

Namely, by varying the thickness of the portions of the substrate for mounting the respective semiconductor light emitting elements, the thickness of corresponding portions of the wavelength conversion layer can be varied for each of the groups of the semiconductor light emitting elements.

A substrate formed of silicon can be processed by anisotropic etching or the like to vary the thickness of the portions of the substrate for mounting the respective semiconductor light emitting elements.

When the substrate is formed of ceramics, it can be processed by dry etching, electro plating, or the like, to vary the thickness of the portions of the substrate for mounting the respective semiconductor light emitting elements.

In another aspect of a semiconductor light emitting device made in accordance with principles of the presently disclosed subject matter, the plurality of semiconductor light emitting elements can be electrically connected so as to be driven group by group.

This configuration can separately drive the respective groups of the semiconductor light emitting elements, so that the color temperature of the illumination light can be easily adjusted.

According to the presently disclosed subject matter, a small-sized semiconductor light emitting device with a simple configuration can be provided which can easily vary the color temperature of the illuminated light.

Each semiconductor light emitting element can be provided with a corresponding portion of a wavelength conversion layer thereabove in accordance with the color temperature specification. Accordingly, the semiconductor light emitting elements can be driven at a maximum rated current, and can provide a highly efficient semiconductor light emitting device that can emit light with a relatively large amount of light.

BRIEF DESCRIPTION OF DRAWINGS

These and other characteristics, features, and advantages of the presently disclosed subject matter will become clear from the following description with reference to the accompanying drawings, wherein.

DETAILED DESCRIPTION OF EMBODIMENTS

Figure 1:
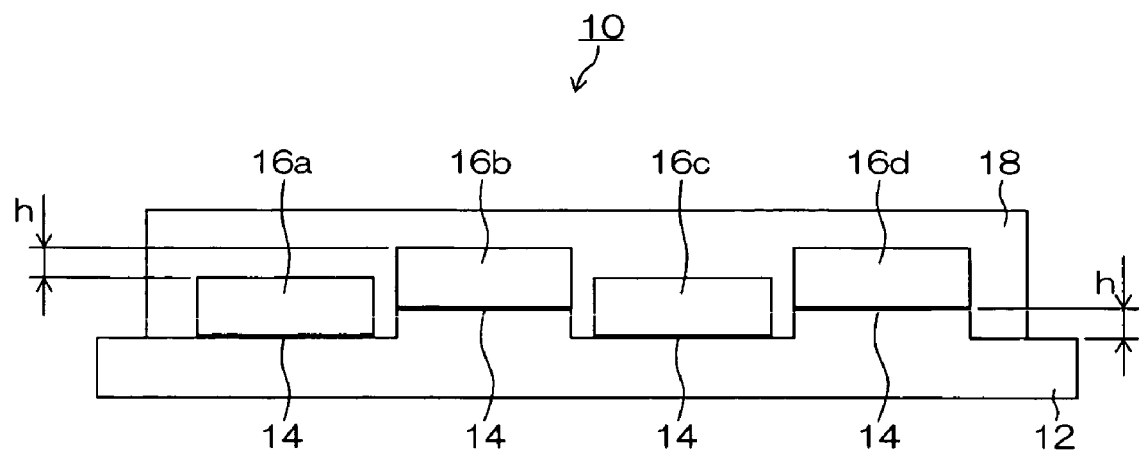
FIG. 1 is a cross-sectional view showing the configuration of a semiconductor light emitting device of a first exemplary embodiment made in accordance with principles of the presently disclosed subject matter.

A description will now be made with respect to various exemplary embodiments of semiconductor light emitting devices made in accordance with principles of the presently disclosed subject matter with reference to the accompanying drawings. It should be noted that both boundary values of the numerical range are all inclusive (including the maximum and minimum values of the range).

A description will now be given of a first exemplary embodiment with reference to FIG. 1, which is a cross-sectional view of a semiconductor light emitting device 10.

The semiconductor light emitting device 10 can include a substrate 12, electrode wiring 14 formed on the substrate 12, a plurality (four in the illustrated example) of semiconductor light emitting elements 16a, 16b, 16c, and 16d mounted on the wiring 14, and a wavelength conversion layer 18 surrounding the semiconductor light emitting elements 16a, 16b, 16c, and 16d. Note that the semiconductor light emitting elements 16a, 16b, 16c, and 16d may be collectively referred to as "semiconductor light emitting element 16" hereinafter.

The substrate 12 can be formed of silicon, ceramics, metal plate provided with a circuit pattern, or the like. The substrate 12 has a predetermined step h formed in advance by micromachining technique or the like on the mounting portions for the semiconductor light emitting element 16. When the substrate is formed of silicon, the step h can be formed by an anisotropic etching technique or selective wet etching processing to form it in micron order on the substrate 12. When the substrate is formed of ceramics or metal plate, a base material or an electrode material may be processed by gas-phase dry etching or electroplating to form the step h on the substrate 12.

The electrode wiring 14 can be formed on the mounting portions for the semiconductor light emitting element 16. The semiconductor light emitting elements 16a, 16b, 16c, and 16d as shown are mounted on the respective mounting portions of the substrate 12 to be electrically connected to the electrode wiring 14. The semiconductor light emitting elements 16a, 16b, 16c, and 16d are supplied with a drive current from outside via the electrode wiring 14 to be driven. The electrode wiring 14 can have an appropriate pattern in accordance with the arrangement, number, or the like of the to-be-mounted semiconductor light emitting element 16.

In the present exemplary embodiment, as the step h is formed on the substrate 12, the distance from the rear surface of the substrate 12 to the surface of the semiconductor light emitting elements 16a, 16c and that from the rear surface of the substrate 12 to the surface of the semiconductor light emitting elements 16b, 16d are different from each other by the height difference h corresponding to the step height h on the substrate 12. This height difference h for the semiconductor light emitting elements 16 can be precisely controlled by the fine microprocessing of the step h on the substrate 12.

In this instance, the plurality of semiconductor light emitting elements 16a, 16b, 16c, and 16d mounted on the substrate 12 can be grouped. In the present exemplary embodiment, they are grouped in accordance with the height from the rear surface of the substrate 12 to the upper surface of the element 16. The semiconductor light emitting elements 16a and 16c are mounted on mounting portions that do not include a step, and accordingly, they constitute a first semiconductor light emitting element group. On the other hand, the semiconductor light emitting elements 16b and 16d are mounted on mounting portions with the step h, and accordingly, they constitute a second semiconductor light emitting element group.

The semiconductor light emitting element 16 can be a blue LED composed of an element substrate and a semiconductor epitaxial layer having a light emission portion formed on the element substrate. The semiconductor epitaxial layer can be formed of an appropriate semiconductor material such as a GaN based material, an AlGaInP based material, or the like in accordance with a desired color tone of emission light.

The wavelength conversion layer 18 is, for example, composed of a wavelength conversion material and a thermoplastic resin or the like. The wavelength conversion material can be excited by light emitted from the semiconductor light emitting element 16 and thus emits light that has a different wavelength as compared to that of light emitted from the semiconductor light emitting element 16, thereby wavelength converting the light. The wavelength conversion material may be a phosphor of which type can be determined while taking the required color or light amount of the desired semiconductor light emitting device 10 into consideration. For example, when the device is required to employ a blue LED, examples of the phosphor include YAG phosphors, silicate phosphors, and the like.

The wavelength conversion layer 18 can be formed by coating, printing, or the like. For example, a thermosetting resin containing a phosphor is coated by stencil application over the entire semiconductor light emitting elements 16a, 16b, 16c, and 16d to integrate them. Accordingly, the wavelength conversion layer 18 having a substantially uniform composition can be formed surrounding the semiconductor light emitting elements 16a, 16b, 16c, and 16d. Furthermore, the height from the rear surface of the substrate 12 and the upper surface of the wavelength conversion layer 18 can be constant. Since the step h is previously formed on the substrate 12, the thickness of the portion of the wavelength conversion layer over the second semiconductor light emitting element group mounted on the higher portion is thinner than that over the first semiconductor light emitting group by the thickness of the step h.

The wavelength conversion layer 18 can be formed by injecting a phosphor-containing resin into a wall provided around the plurality of semiconductor light emitting element groups and curing the resin. In this case, the wavelength conversion layer having different thickness portions can be formed by a single resin application or injection process.

A description will now be given of the light emission from the thus-configured semiconductor light emitting device 10. The light emitted from the first semiconductor light emitting element group is mixed light composed of light emitted from the semiconductor light emitting elements 16a and 16c and light that is wavelength converted by the wavelength conversion layer 18. The light emitted from the second semiconductor light emitting element group is mixed light composed of light emitted from the semiconductor light emitting elements 16b and 16d and light that is wavelength converted by the wavelength conversion layer 18.

The combination of the semiconductor light emitting element 16 and the wavelength conversion layer 18 can be composed of a blue LED and YAG or silicate based phosphor, but the presently disclosed subject matter is not limited thereto. In the present exemplary embodiment, the wavelength conversion layer 18 surrounds the semiconductor light emitting elements 16. A light-transmitting resin can be provided between the wavelength conversion layer 18 and the semiconductor light emitting element 16.

The wavelength conversion layer 18 is integrally formed so as to have a uniform density distribution of phosphor. The uniform density distribution of phosphor can contribute to easy adjustment of color temperature by means of thickness adjustment. In the present exemplary embodiment, the light from the first semiconductor light emitting element group is different from light from the second semiconductor light emitting element group in color temperature due to the thickness difference h of the wavelength conversion layer 18. The thickness of the wavelength conversion layer 18 above the first semiconductor light emitting element group is greater than the thickness of the wavelength conversion layer 18 above the second semiconductor light emitting element group. Accordingly, light from the first semiconductor light emitting element group is more wavelength converted by the wavelength conversion layer 18, resulting in emission light with a color temperature that is shifted to near the color temperature of light from the wavelength conversion material.

The thickness difference h between the portions of the wavelength conversion layer 18 can be precisely controlled by the corresponding step h of the substrate 12 precisely formed by microprocessing. The wavelength conversion layer 18 located above semiconductor light emitting elements that belong to the same group can emit the same desired light color. Accordingly, the presently disclosed subject matter can partly vary the thickness of the wavelength conversion layer 18 above the grouped semiconductor light emitting elements to produce precise differences in color temperatures, respectively. Thus, a configuration of a semiconductor light emitting device 10 that provides color temperature adjustment can be achieved.

The wavelength conversion layer 18 can be integrally fabricated with ease, facilitating the manufacture of a color temperature variable semiconductor light emitting device. Although the wavelength conversion layer 18 has different thickness portions, it can be fabricated with a single step. Accordingly, the color temperature variable semiconductor light emitting device can be provided with fewer steps.

Furthermore, as the wavelength conversion layer 18 which has different thickness portions can be formed on a single substrate, less steps are also sufficient for achieving the intended purpose. As precise color control can be achieved with the integrated wavelength conversion layer 18, the distance between the semiconductor light emitting elements can be decreased. This configuration can also facilitate color mixture more uniformly.

Figure 2:
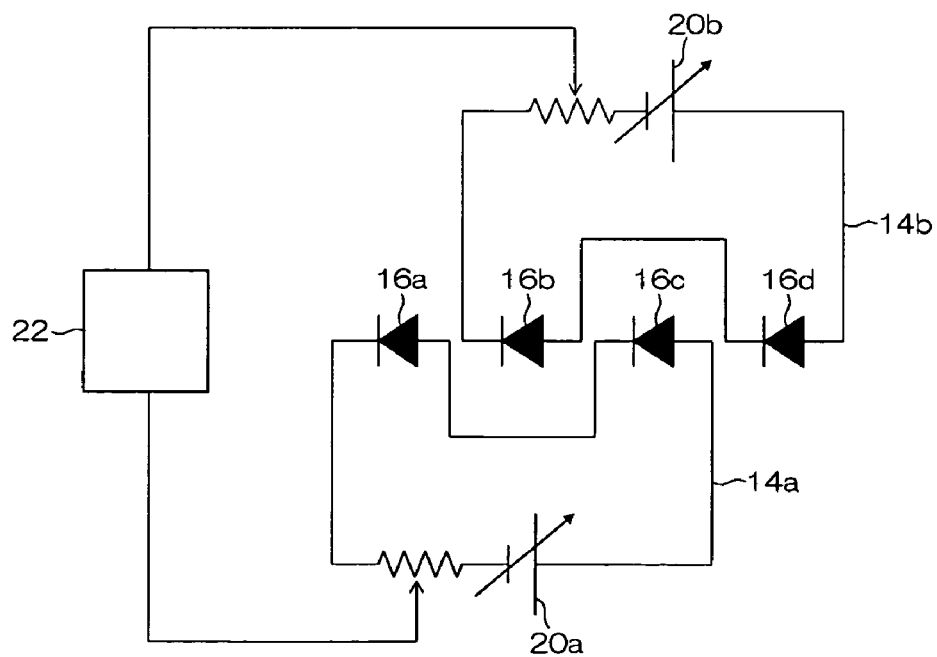
FIG. 2 is a schematic circuit diagram which can be employed by the semiconductor light emitting device of FIG. 1.

FIG. 2 shows an exemplary circuit configuration for the color temperature variable semiconductor light emitting device according to the first exemplary embodiment as shown in FIG. 1. The semiconductor light emitting elements 16a and 16c are mounted on the single substrate to be electrically connected to the electrode wiring 14a in series. The semiconductor light emitting elements 16b and 16d are mounted on the substrate to be electrically connected to the electrode wiring 14b in series. The electrode wirings 14a and 14b are connected to DC sources 20a and 20b, respectively. This circuit configuration can be used to separately drive the semiconductor light emitting elements 16a and 16c, and 16b and 16d.

The DC sources 20a and 20b can be electrically connected to a controller 22. The controller 22 can control the total supply power to the semiconductor light emitting elements 16a, 16b, 16c, and 16d and also separately adjust the light amount for the semiconductor light emitting elements 16a and 16b, and 16c and 16d. Accordingly, the color temperature of the semiconductor light emitting device can be varied with ease while the total supply power to the semiconductor light emitting device can be maintained constant.

Namely, the semiconductor light emitting elements 16a, 16b, 16c, and 16d can be provided with respective wavelength conversion layer portions with corresponding thicknesses in accordance with a desired color temperature, and the semiconductor light emitting device can be driven with the maximum rated current. Accordingly, when compared with the system utilizing a unicolor light emitting element as disclosed in Japanese Patent Application Laid-Open No. 2007-059260, a semiconductor light emitting device made in accordance with the principle of the presently disclosed subject matter can be achieved with a high light amount and with high efficiency.

Figure 3:
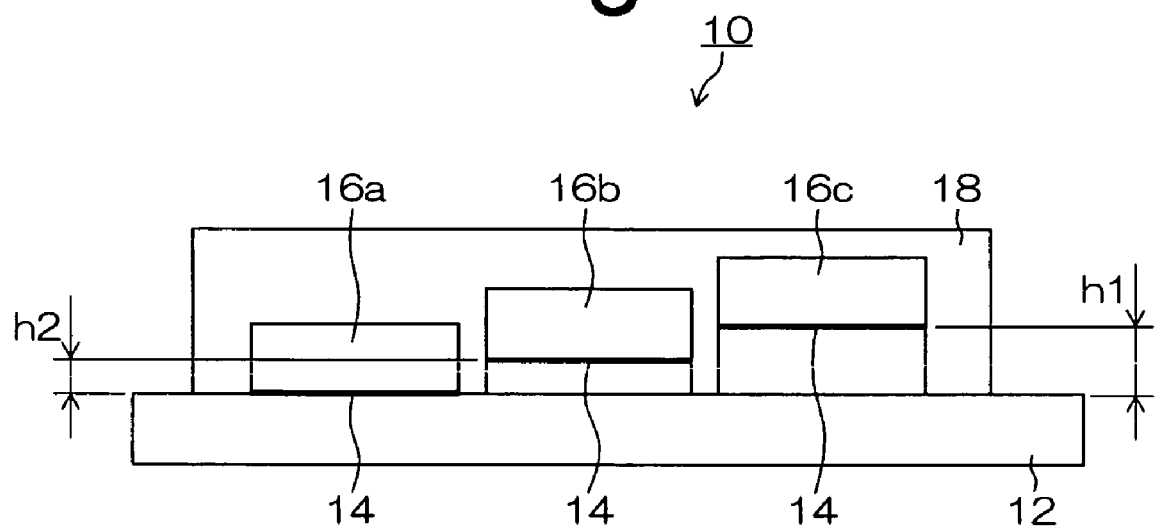
FIG. 3 is a cross-sectional view showing the configuration of a semiconductor light emitting device of an application example of the first exemplary embodiment.

FIG. 3 is a cross-sectional view illustrating a modification of the first exemplary embodiment. The modification can have the same configuration as that of the first exemplary embodiment except that a plurality of steps h1 and h2 are provided. The steps h1 and h2 of the substrate 12 can be formed on the substrate 12 by adding the same process step as in the first exemplary embodiment, thereby forming a plurality of steps. In this way, the thickness differences h1 and h2 of the wavelength conversion layer 18 can be adjusted corresponding to the precisely processed steps h1 and h2.

In this modified example, the plurality of semiconductor light emitting elements 16a, 16b, and 16c mounted on the substrate 12 can be grouped into three. In this case, the semiconductor light emitting element 16a constitutes the first semiconductor light emitting element group, the semiconductor light emitting element 16b constitutes the second semiconductor light emitting element group, and the semiconductor light emitting element 16c constitutes the third semiconductor light emitting element group. The wavelength conversion layer 18 has different thickness areas above the respective groups that include the semiconductor light emitting elements 16a to 16c, respectively.

In this modified example, the plurality of steps h (h1 and h2) can produce various light colors including the emission light color as shown in the first exemplary embodiment and the combination of the intermediate emission light color components. Furthermore, this modification can improve the color unevenness when all of the semiconductor light emitting elements 16 are turned on. In this modification, for example, adjacent semiconductor light emitting elements 16a and 16b out of the three elements can be turned on for the entire semiconductor light emitting device to emit light with intermediate color. In accordance with the use environment, consumed power, and the like, the combination can be appropriately selected. In general, the greater the number of provided steps h formed on the substrate 12, the less unevenness in color can be provided by the semiconductor light emitting device 10.

A description will now be given of the case where the device having the configuration of FIG. 1 can be used to emit white light (pseudo-white light). In this embodiment, GaN based light emitting diodes are mounted on a substrate 12 to form the semiconductor light emitting element 16. These diodes can have the same composition, the same shape and the same size and can emit the same blue light. YAG based phosphor can be used as the wavelength conversion material contained in the wavelength conversion layer 18. The YAG based phosphor can be excited by the blue light from the blue LED to emit yellow light (which can be combined with the blue light to form a white, yellowish white, or bluish white light).

In this case, the light emitted from the second semiconductor light emitting element group with the thin wavelength conversion layer 18 is bluish white light having a color temperature of approximately 7000 K. On the other hand, the light emitted from the semiconductor light emitting element group with the thick wavelength conversion layer 18 is yellowish white light having a color temperature of approximately 3000 K. This can result in light that has a color that is proportional to the thickness of the wavelength conversion layer 18 that has a uniform concentration distribution of the phosphor (or is proportional to the amount of phosphor in the light emission direction above the semiconductor light emitting element 16). Specifically, the light from the second semiconductor light emitting element group is shifted to the original color of light from the semiconductor light emitting element because of the small ratio of the light that is wavelength converted by the wavelength conversion layer 18. The light from the first semiconductor light emitting element group is shifted to the color of light from the wavelength conversion material because of the large ratio of the light that is wavelength converted by the wavelength conversion layer 18.

Since the step h on the substrate 12 can be precisely formed, the wavelength conversion layer portions formed above the semiconductor light emitting elements mounted on the same height can emit uniform light as compared to one another.

The thickness of the portions of the wavelength conversion layer 18 can be determined, for example, in accordance with the size of the semiconductor light emitting element that is used. For example, when the semiconductor light emitting element 16 has its outer side of 1 mm and thickness of 100 μm, the thickness of the portion of the wavelength conversion layer 18 above the second semiconductor light emitting element group can be in the range of 20 μm to 200 μm (approximately, $\frac{1}{50}$ to $\frac{1}{5}$ of the size of the element side). The thickness of the portion of the wavelength conversion layer 18 above the first semiconductor light emitting element group can be in the range of 50 μm to 500 μm (approximately, $\frac{1}{20}$ to $\frac{1}{2}$ of the size of the element side). In this way, light emitted from the semiconductor light emitting device as a whole can be adjusted within the white color range for illumination on the trajectory of blackbody radiation.

When the thickness of the wavelength conversion layer 18 is less than $\frac{1}{5}$ of the size of the element side, the blue component is too much when the element group is turned on. In this case, the emitted light may be out of the white color range for illumination.

When the thickness of the wavelength conversion layer 18 is more than $\frac{1}{2}$ of the size of the element side, the yellow component is too much when the element group is turned on. In this case, the emitted light may also be out of the white color range for illumination.

In view of this and taking the white color range for illumination into consideration, the thickness of the wavelength conversion layer 18 can be in the range of $\frac{1}{50}$ to $\frac{1}{2}$ of the size of the element side.

Figure 9:
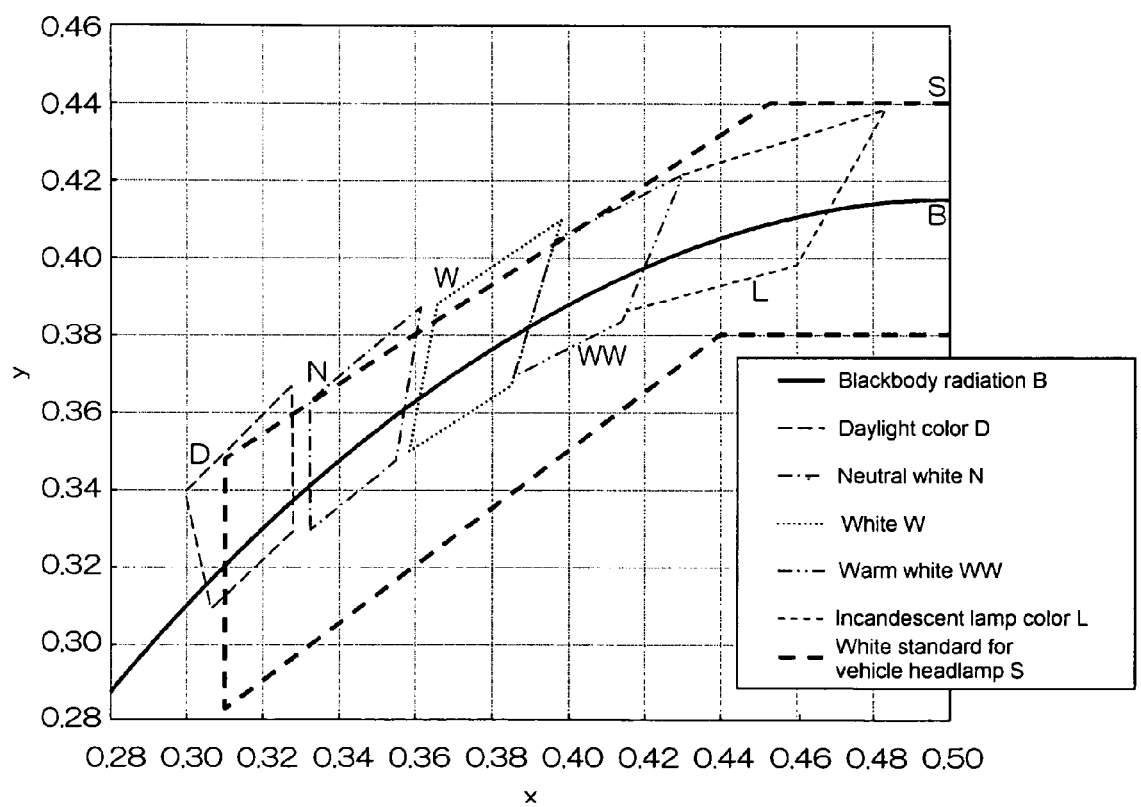
FIG. 9 is a graph showing the range of white light for illumination.

FIG. 9 shows the white color range for illumination. As shown in FIG. 9, the specified white color ranges for respective illumination purposes are determined in accordance with, for example, JIS Z9112 for the Classification of fluorescent lamps by chromaticity, and SEA for white light of vehicle headlamps. A semiconductor light emitting device made in accordance with the principles of the presently disclosed subject matter can achieve various emission light color with appropriate color temperature suitable for use in the specific white color ranges by simply adjusting the thickness of the wavelength conversion layer.

Figure 4:
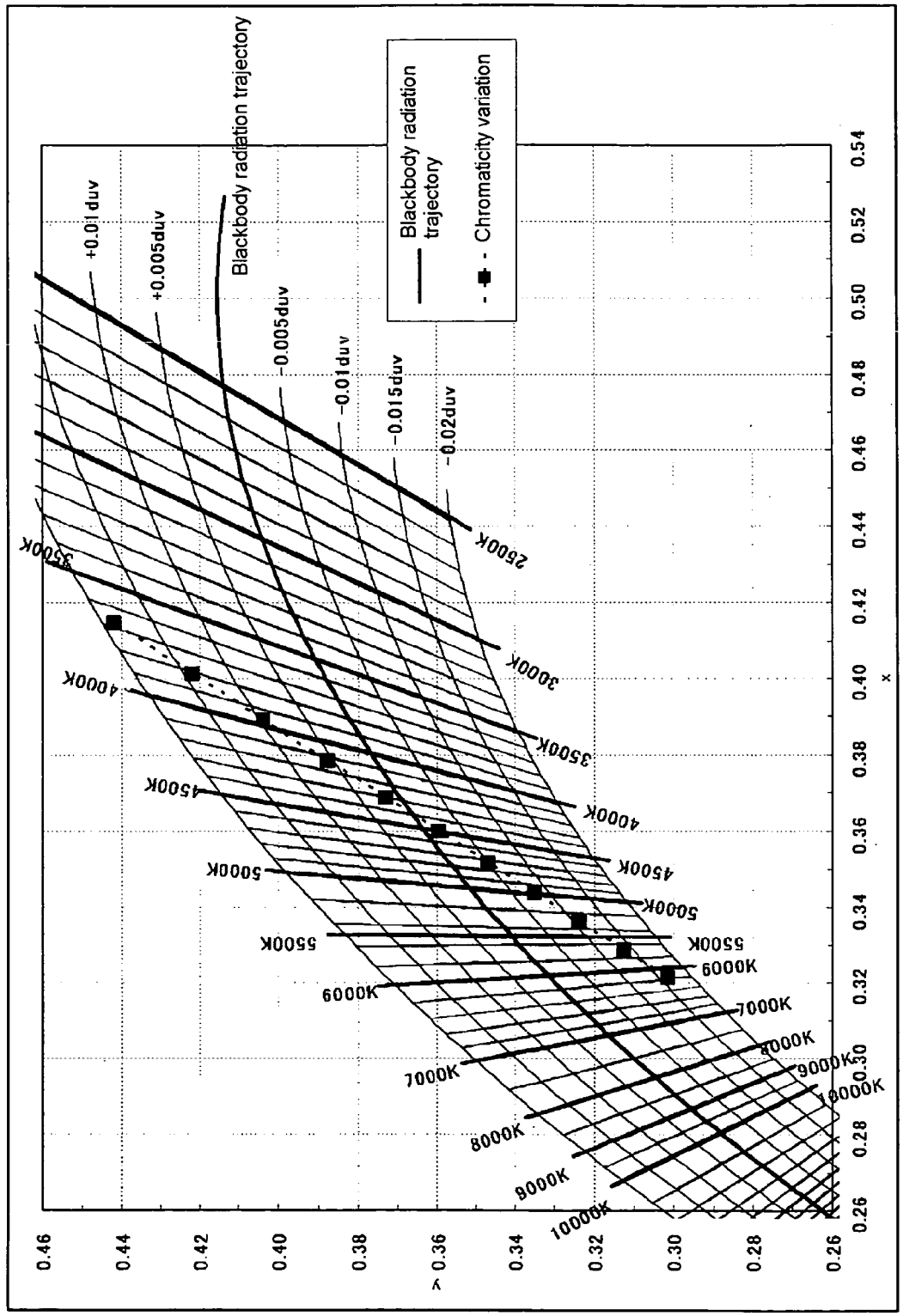
FIG. 4 is a chromaticity diagram showing the range of illumination white light from the semiconductor light emitting device of the first exemplary embodiment.

FIG. 4 shows several examples of variation in the emission light color under the following conditions.

The semiconductor light emitting device having the configuration of FIG. 1 is designed such that the step h is 200 µm, the thickness of the wavelength conversion layer above the second semiconductor light emitting element group is 100 µm, the thickness of the wavelength conversion layer above the first semiconductor light emitting element group is 300 µm, and the semiconductor light emitting element has an outer side of 1 mm and thickness of 100 µm.

When the total power amount supplied to the semiconductor light emitting device is made constant and the current applied to each of the first and second semiconductor light emitting element groups is changed, the variation in emission light color is plotted in the graph of FIG. 4.

The lower left plot represents the value when only the second semiconductor light emitting element group is turned on. The upper right plot represents the value when only the first semiconductor light emitting element group is turned on. Then, the current application ratio between the first and the second semiconductor light emitting element groups is varied from 0:100 (%) to 100:0 (%). As a result, the plots of the emission light color from the semiconductor light emitting device connect the lower left plot to the upper right plot as shown in FIG. 4.

Accordingly, if the thickness of the wavelength conversion layer is adjusted so that the values of the lower left plot and the upper right plot are maintained within the specified white color range for illumination, the emission light color (color temperature) from the semiconductor light emitting device can be varied freely within the white color range for illumination by varying only the applied current to each semiconductor light emitting element group.

Figure 5A:
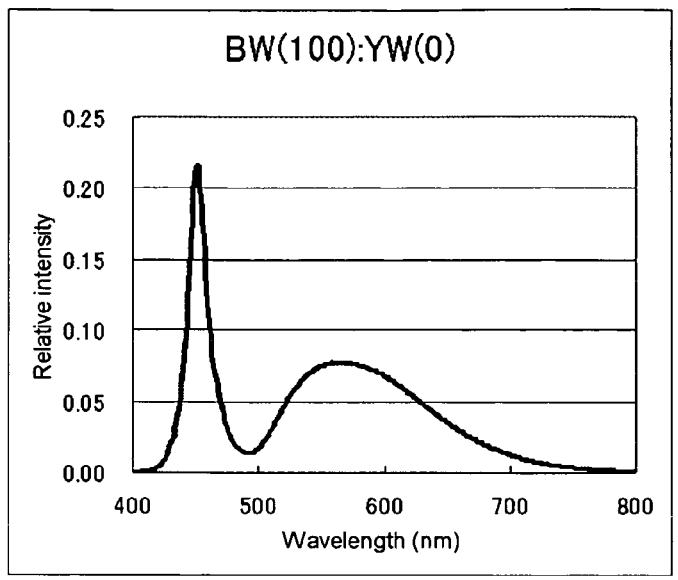
FIGS. 5A to 5C are graphs of emission spectrum of both ends and intermediate plotted data as shown in the chromaticity diagram of FIG. 4.
Figure 5B:
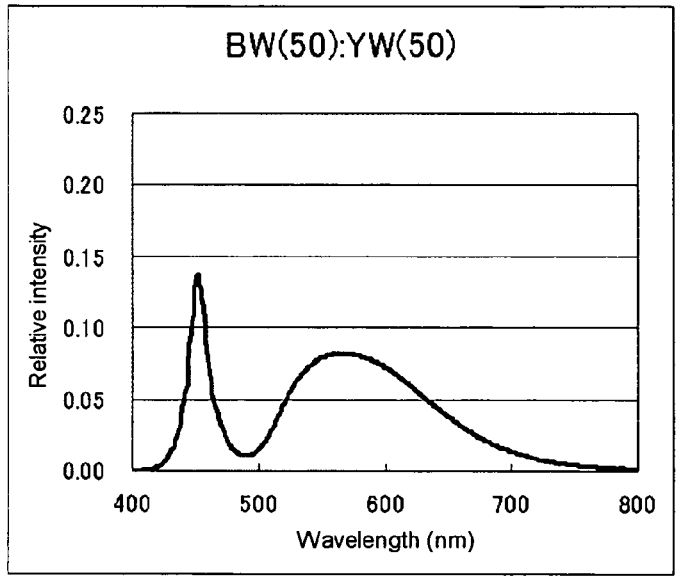
Figure 5C:
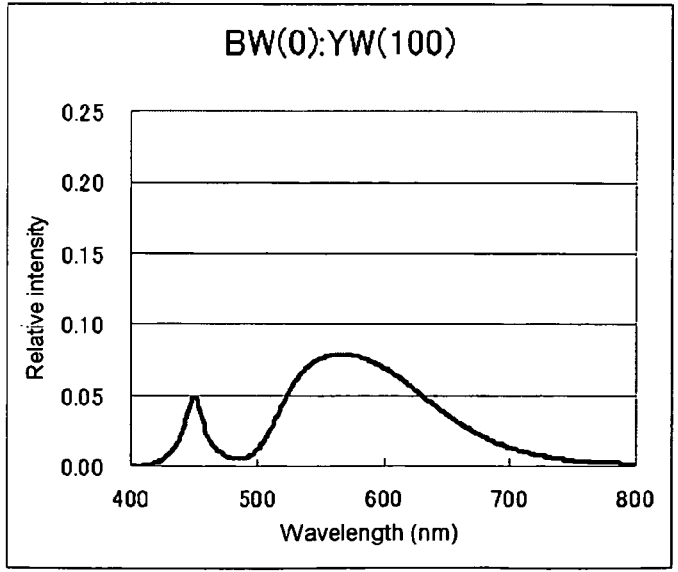

FIGS. 5A to 5C show emission spectra of the light whose color is plotted at the upper right position, lower left position, or middle position therebetween. Specifically, FIG. 5A is the emission spectrum for the light at the lower left plot, FIG. 5B is the emission spectrum for the light at the middle plot, and FIG. 5C is the emission spectrum for the light at the upper right plot.

As shown in FIG. 5A, the graph for the light at the lower left plot shows that the relative intensity of blue light from the semiconductor light emitting element is higher than that of yellow light from the wavelength conversion layer (material). In this case, it is thus clearly understood that the entire semiconductor light emitting device can emit bluish white light.

As shown in FIG. 5C, the graph for the light at the upper right plot shows that the relative intensity of blue light from the semiconductor light emitting element is lower than that of yellow light from the wavelength conversion layer (material). Accordingly, in this case the entire semiconductor light emitting device can emit yellowish white light.

As shown in FIG. 5B, the graph for the light at the middle plot shows that the relative intensity of blue light from the semiconductor light emitting element is almost the same as that of yellow light from the wavelength conversion layer (material). In this case, it is thus clearly understood that the entire semiconductor light emitting device can emit pseudo white light without color shift.

Figure 6:
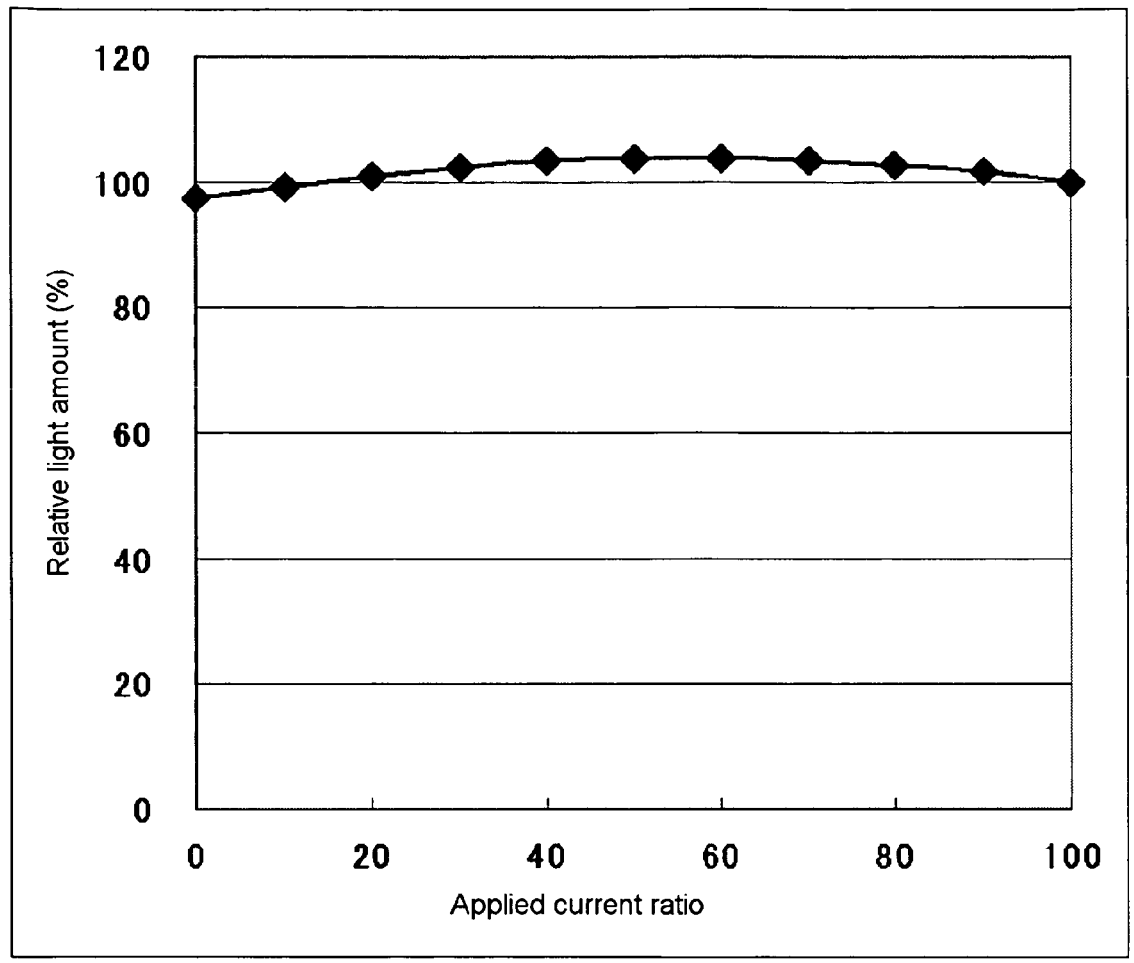
FIG. 6 is a graph showing relative light amounts of the semiconductor light emitting device of the first exemplary embodiment.

FIG. 6 shows the light amount variation of the entire semiconductor light emitting device when a constant power is supplied while the current ratio applied to the first and the second semiconductor light emitting element groups is varied from 100:0 to 0:100 under the same conditions as those described with reference to FIG. 4. As shown in FIG. 6, the semiconductor light emitting device of the presently disclosed subject matter can emit light without the light amount lowered even when the current ratio is varied. In this case, the semiconductor light emitting elements being used have the same components and are driven with the same driving current. Accordingly, the driving method can be simplified. Since the light amount from the semiconductor light emitting device as a whole is not changed, the maximum amount of light emitted from each semiconductor light emitting element is fully utilized for illumination.

Figure 7:
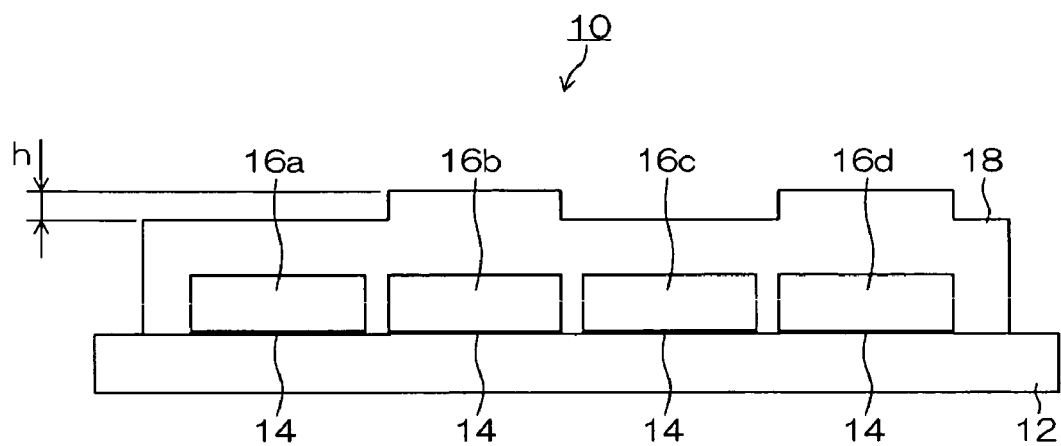
FIG. 7 is a cross-sectional view showing the configuration of a semiconductor light emitting device of a second exemplary embodiment made in accordance with the principles of the presently disclosed subject matter.

A second exemplary embodiment of the presently disclosed subject matter will be described with reference to FIG. 7, which is a cross-sectional view of the semiconductor light emitting device 10. Note that the same components as in the first exemplary embodiment are denoted by the same reference numerals and descriptions thereof are omitted appropriately.

The semiconductor light emitting device 10 can include a substrate 12, electrode wiring 14 formed on the substrate 12, a plurality (four in the illustrated example) of semiconductor light emitting elements 16a, 16b, 16c, and 16d mounted on the wiring 14, and a wavelength conversion layer 18 surrounding the semiconductor light emitting elements 16a, 16b, 16c, and 16d. In the semiconductor light emitting device 10 of the second exemplary embodiment, the configuration for forming the difference h of the portions of the wavelength conversion layer 18 is different from the first exemplary embodiment. In the second exemplary embodiment, the step h is not formed on the substrate 12, but on the outermost surface of the wavelength conversion layer 18.

In the present exemplary embodiment as in the first exemplary embodiment, the plurality of semiconductor light emitting elements 16a, 16b, 16c, and 16d mounted on the substrate 12 can be grouped into two or more groups. The semiconductor light emitting elements 16a and 16c can constitute a first semiconductor light emitting element group, and the semiconductor light emitting elements 16b and 16d can constitute a second semiconductor light emitting element group. In the present exemplary embodiment, the thicknesses of the portions of the wavelength conversion layer 18 corresponding to the first and second semiconductor light emitting element groups provided on the same level are different from each other. Therefore, the steps h are formed on the outermost surface of the wavelength conversion layer 18 corresponding to the element groups.

A description will now be given of ab example of how steps h can be formed on the outermost surface of the wavelength conversion layer 18. For example, first a thermosetting resin containing a certain phosphor is applied by stencil printing to form a wavelength conversion layer covering the surrounding area of the elements 16a to 16c. The formed wavelength conversion layer has a substantial rectangular solid shape, and accordingly, the distance from the rear surface of the substrate 12 to the upper surface of the wavelength conversion layer is constant.

Then, a second stencil printing is applied only to areas above the semiconductor light emitting elements 16b and 16d constituting the second group to form the wavelength conversion layer 18 with the steps h thereon. This configuration can reduce the manufacturing costs for the substrate 12 because the substrate 12 is not required to be processed using forming steps.

Note that the presently disclosed subject matter can employ not only the stencil printing but also similar methods for forming the steps h on the surface of the wavelength conversion layer.

Figure 8:
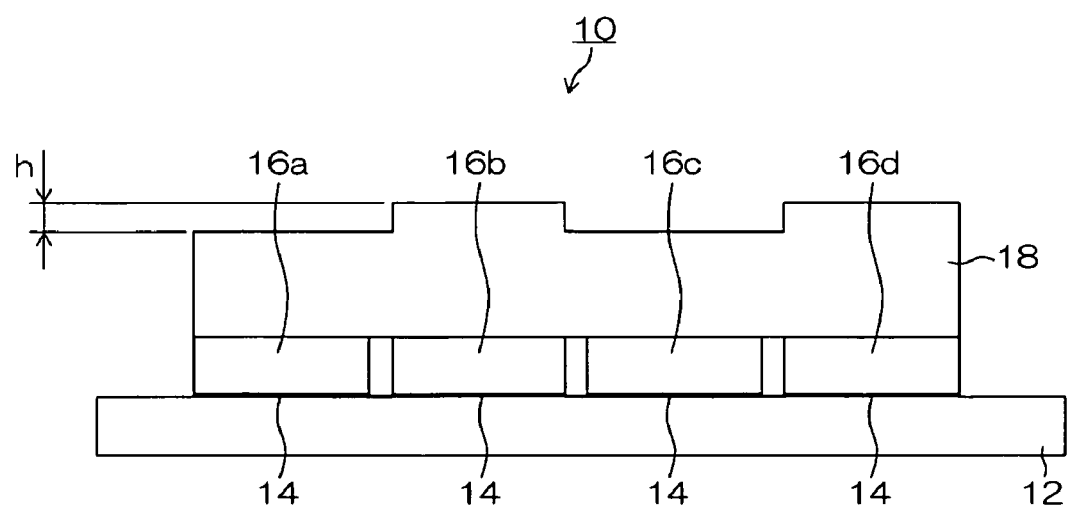
FIG. 8 is a cross-sectional view showing the configuration of a semiconductor light emitting device of an application example of the first exemplary embodiment.

FIG. 8 is a cross-sectional view showing the configuration of a modification of the second exemplary embodiment. The modification is suitable for a semiconductor light emitting element 16 having an opaque substrate and a semiconductor epitaxial layer having a light emission portion formed or disposed on the opaque substrate.

In this modification, the semiconductor light emitting device 10 can include a substrate 12, electrode wiring 14 formed on the substrate 12, a plurality (four in the illustrated example) of semiconductor light emitting elements 16a, 16b, 16c, and 16d mounted on the wiring 14, and a wavelength conversion layer 18 formed on the upper surfaces of the semiconductor light emitting elements 16a, 16b, 16c, and 16d.

In this case, the light emitted from the light emission portion cannot pass through the opaque substrate. Accordingly, light cannot be emitted from the side faces of the semiconductor light emitting element 16, meaning that the side face cannot be a light emission surface.

Therefore, it is not necessary to provide the wavelength conversion layer 18 to entirely cover the semiconductor light emitting element 16 including the side surface. In the illustrated example shown in FIG. 8, the semiconductor light emitting device 10 can emit light with variable color temperatures by covering only the upper surface of the semiconductor light emitting element 16.

The wavelength conversion layer 18 can be separately molded to have a precise step h in advance. The pre-fabricated wavelength conversion layer 18 can be positioned adjacent to the element groups to facilitate the fabrication steps.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

The invention claimed is:

1. A semiconductor light emitting device comprising:
   a substrate having electrode wiring;
   a plurality of semiconductor light emitting elements electrically connected to the electrode wiring of the substrate and each configured to emit light along a respective central light emitting axis of a respective one of the semiconductor light emitting elements, the semiconductor light emitting elements being grouped into at least a first group and a second group; and
   a wavelength conversion layer configured to wavelength-convert at least a portion of the light emitted from the plurality of semiconductor light emitting elements, the wavelength conversion layer formed as an integral body and having a first thickness along the light emitting axis of respective semiconductor light emitting elements of the first group and a second thickness along the light emitting axis of respective semiconductor light emitting elements of the second group, the first thickness being different from the second thickness.

2. The semiconductor light emitting device according to claim 1, wherein the plurality of semiconductor light emitting elements have the same composition.

3. The semiconductor light emitting device according to claim 1, wherein the substrate has mounting portions for mounting the semiconductor light emitting elements thereon, the mounting portions having a varied thickness in a light emitting direction of the semiconductor light emitting device so that the wavelength conversion layer has different thicknesses above the semiconductor light emitting elements.

4. The semiconductor light emitting device according to claim 2, wherein the substrate has mounting portions for mounting the semiconductor light emitting elements thereon, the mounting portions having a varied thickness in a light emitting direction of the semiconductor light emitting device so that the wavelength conversion layer has different thicknesses above the semiconductor light emitting elements.

5. The semiconductor light emitting device according to claim 1, wherein the plurality of semiconductor light emitting elements are electrically connected so as to be selectively driven group by group.

6. The semiconductor light emitting device according to claim 2, wherein the plurality of semiconductor light emitting elements are electrically connected so as to be selectively driven group by group.

7. The semiconductor light emitting device according to claim 3, wherein the plurality of semiconductor light emitting elements are electrically connected so as to be selectively driven group by group.

8. The semiconductor light emitting device according to claim 4, wherein the plurality of semiconductor light emitting elements are electrically connected so as to be selectively driven group by group.

9. The semiconductor light emitting device according to claim 1, wherein a mounting surface of the substrate is substantially planar, and the wavelength conversion layer has a first thickness in a direction substantially perpendicular to the planar mounting surface, the first thickness located in a light emitting direction above the semiconductor light emitting elements of the first group, and the wavelength conversion layer has a second thickness in a direction substantially perpendicular to the planar mounting surface, the second thickness located in a light emitting direction above the semiconductor light emitting elements of the second group, and the first thickness is different from the second thickness of the wavelength conversion layer.

10. The semiconductor light emitting device according to claim 2, wherein a mounting surface of the substrate is substantially planar, and the wavelength conversion layer has a first thickness in a direction substantially perpendicular to the planar mounting surface, the first thickness located in a light emitting direction above the semiconductor light emitting elements of the first group, and the wavelength conversion layer has a second thickness in a direction substantially perpendicular to the planar mounting surface, the second thickness located in a light emitting direction above the semiconductor light emitting elements of the second group, and the first thickness is different from the second thickness of the wavelength conversion layer.

11. The semiconductor light emitting device according to claim 5, wherein a mounting surface of the substrate is substantially planar, and the wavelength conversion layer has a first thickness in a direction substantially perpendicular to the planar mounting surface, the first thickness located in a light emitting direction above the semiconductor light emitting elements of the first group, and the wavelength conversion layer has a second thickness in a direction substantially perpendicular to the planar mounting surface, the second thickness located in a light emitting direction above the semiconductor light emitting elements of the second group, and the first thickness is different from the second thickness of the wavelength conversion layer.

12. The semiconductor light emitting device according to claim 1, wherein the wavelength conversion layer has a top surface spaced from the semiconductor light emitting elements in a light emitting direction such that the top surface is located above the semiconductor light emitting elements and intersects the light emitting axis of each of the semiconductor light emitting elements, the top surface having at least one first planar surface and at least one second planar surface, and the first planar surface being substantially parallel with and spaced from the second planar surface.

13. The semiconductor light emitting device according to claim 12, wherein the wavelength conversion layer has a lower surface located in a single plane, the lower surface being directly opposed to the top surface and substantially parallel with both the first planar surface and second planar surface of the top surface.

14. A semiconductor light emitting device comprising:
   a substrate;
   electrode wiring located adjacent the substrate;
   a plurality of semiconductor light emitting elements electrically connected to the electrode wiring and each configured to emit light along a respective light emitting axis; and
   a wavelength conversion layer configured to wavelength-convert at least a portion of the light emitted from the plurality of semiconductor light emitting elements, the wavelength conversion layer having a first thickness as measured along a light emitting axis of a first of the semiconductor light emitting elements, and the wavelength conversion layer having a second thickness as measured along a light emitting axis of a second of the semiconductor light emitting elements, the first thickness being different from the second thickness.

15. The semiconductor light emitting device according to claim 14, wherein the plurality of semiconductor light emitting elements have the same composition.

16. The semiconductor light emitting device according to claim 14, wherein the substrate has mounting portions for mounting the semiconductor light emitting elements thereon, the mounting portions having a first substrate thickness in a direction parallel with and intersecting a linear extension of the light emitting axis of the first of the semiconductor light emitting elements and the mounting portions having a second substrate thickness in a direction parallel with and intersecting a linear extension of the light emitting axis of the second of the semiconductor light emitting elements, the first substrate thickness is different from the second substrate thickness.

17. The semiconductor light emitting device according to claim 14, wherein a mounting surface of the substrate is substantially planar, and the wavelength conversion layer has a first thickness in a direction substantially perpendicular to the planar mounting surface, the first thickness located in a light emitting direction above the first of the semiconductor light emitting elements, and the wavelength conversion layer has a second thickness in a direction substantially perpendicular to the planar mounting surface, the second thickness located above the second of the semiconductor light emitting elements, and the first thickness is different from the second thickness of the wavelength conversion layer.

18. The semiconductor light emitting device according to claim 14, wherein the wavelength conversion layer has a top surface spaced from the semiconductor light emitting elements in a light emitting direction such that the top surface is located above the semiconductor light emitting elements and intersects the light emitting axis of each of the semiconductor light emitting elements, the top surface having at least one first planar surface and at least one second planar surface, and the first planar surface being substantially parallel with and spaced from the second planar surface.

19. The semiconductor light emitting device according to claim 18, wherein the wavelength conversion layer has a lower surface located in a single plane, the lower surface being directly opposed to the top surface and substantially parallel with both the first planar surface and second planar surface of the top surface, the lower surface intersecting the light emitting axis of each of the semiconductor light emitting elements.

* * * * *